United States Patent [19]

Mann, Jr. et al.

[11] Patent Number: 4,840,570

[45] Date of Patent: Jun. 20, 1989

[54] PLUG-IN CARD MODULE

[75] Inventors: James A. Mann, Jr., Richardson; E. Fletcher Haselton, Irving, both of Tex.

[73] Assignee: Teknekron Infoswitch Corporation, Fort Worth, Tex.

[21] Appl. No.: 211,589

[22] Filed: Jun. 27, 1988

[51] Int. Cl.$^4$ ............................................. H01R 23/72
[52] U.S. Cl. ........................................ 439/74; 361/413
[58] Field of Search ..................... 439/62, 64, 65, 74, 439/152, 153, 157, 159, 160, 377; 361/412, 413

[56] References Cited

U.S. PATENT DOCUMENTS

| | | |
|---|---|---|
| 3,360,689 | 12/1967 | Haury . |
| 3,476,258 | 11/1969 | Dorsett . |
| 3,691,430 | 9/1972 | Freitag . |
| 3,767,974 | 10/1973 | Donovan, Jr. et al. . |
| 3,853,379 | 12/1974 | Goodman et al. . |
| 4,243,283 | 1/1981 | McSparran ............................ 439/64 |
| 4,301,494 | 11/1981 | Jordan . |
| 4,313,150 | 1/1982 | Chu . |
| 4,327,835 | 5/1982 | Leger . |
| 4,521,063 | 6/1985 | Milc . |
| 4,530,554 | 7/1985 | Velsher et al. ......................... 439/62 |
| 4,569,001 | 2/1986 | Beun . |
| 4,602,835 | 7/1986 | Baver et al. . |
| 4,603,375 | 7/1986 | Miller et al. .......................... 361/399 |
| 4,661,792 | 4/1987 | Watkins ................................ 361/412 |

FOREIGN PATENT DOCUMENTS

| | | | |
|---|---|---|---|
| 2454508 | 5/1976 | Fed. Rep. of Germany ...... 361/413 |
| 905618 | 9/1962 | United Kingdom ................ 361/412 |

Primary Examiner—Gary F. Paumen
Attorney, Agent, or Firm—David H. Judson

[57] ABSTRACT

A novel plug-in card module for use in a rack module having means for supporting a plurality of such modules in an abutting side-by-side relation. The plug-in module comprises a printed circuit board having at least two pairs of card receiving and guiding rails transversely disposed thereon. Each of the guide rail pairs comprise first and second oppositely-disposed elongate rails removably secured to the printed circuit board. The plug-in module preferably includes at least first and second electrical connectors longitudinally disposed on the printed circuit board in back-to-back or side-by-side relation, each of the electrical connectors disposed adjacent an associated pair of elongate guide rails. To provide increased modularity and ease of circuit component replacement, the plug-in module includes a plurality of individually-removable electrical circuit boards. Each electrical circuit board is slidably supported in a pair of elongate guide rails and includes a leading edge received in the associated electrical connector, and a rear edge having a locking mechanism for locking the electrical circuit board in the pair of elongate guide rails. The module further includes a faceplace having an ejector mechanism for facilitating removal of the module from the rack module.

16 Claims, 3 Drawing Sheets

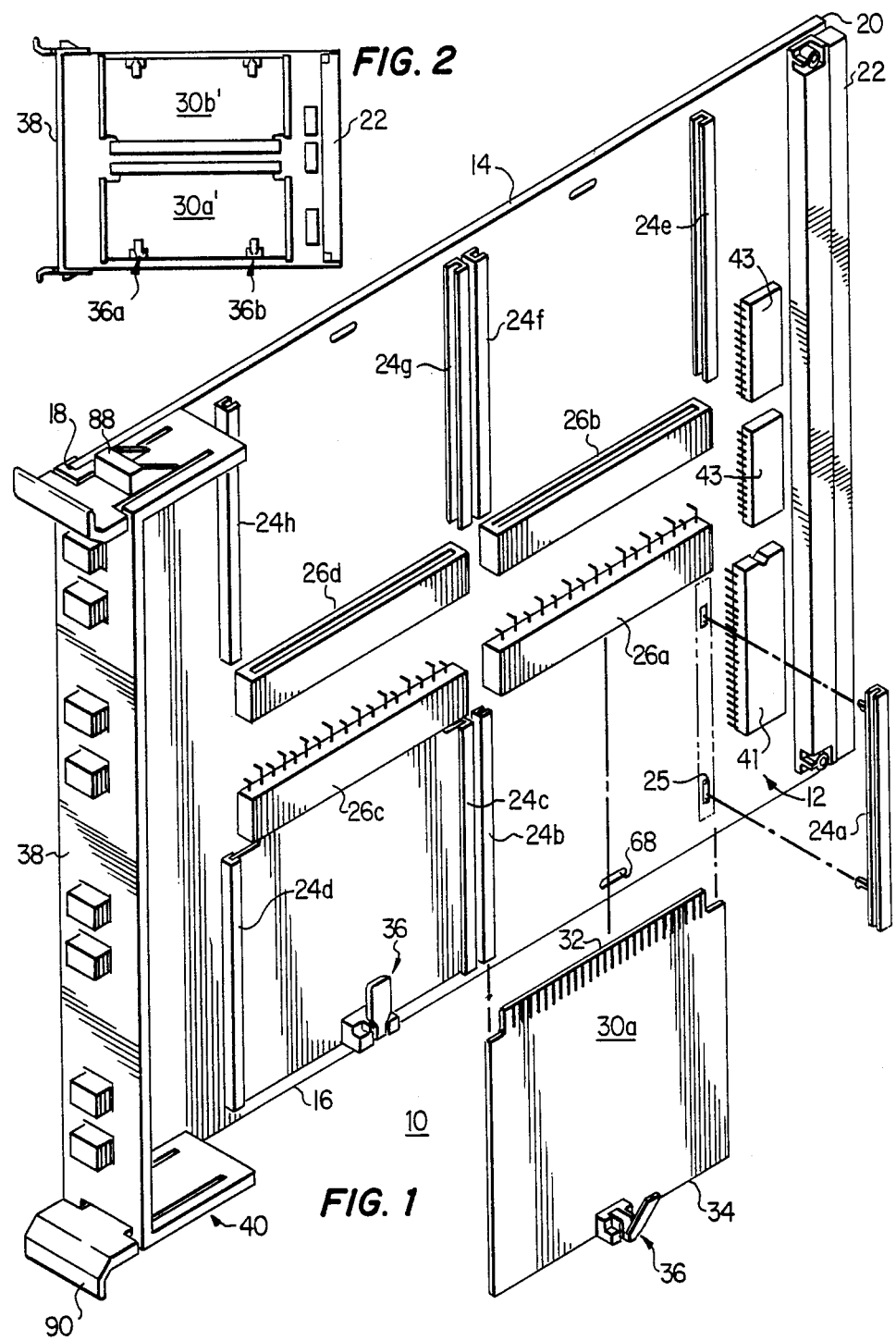

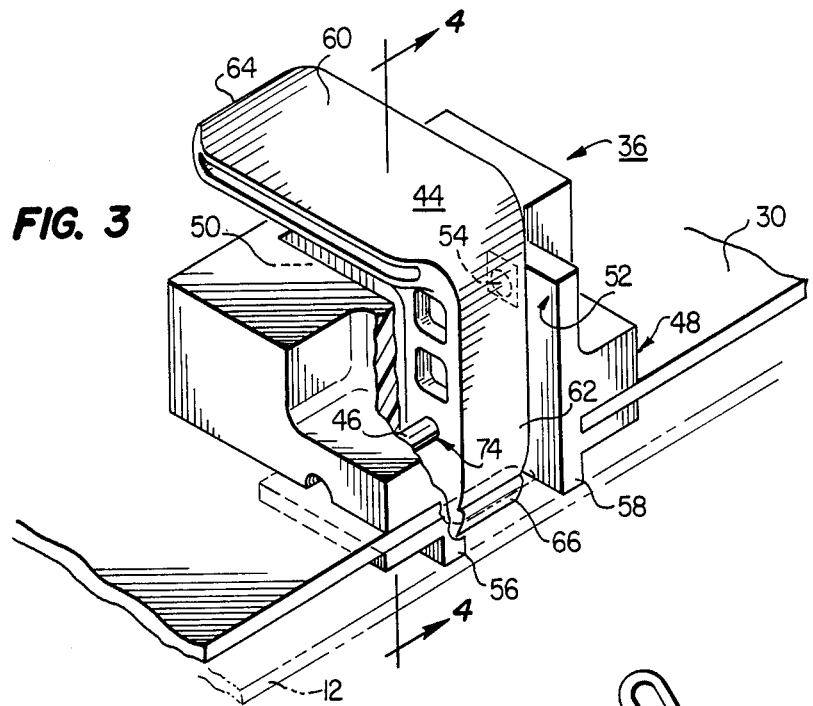
FIG. 3
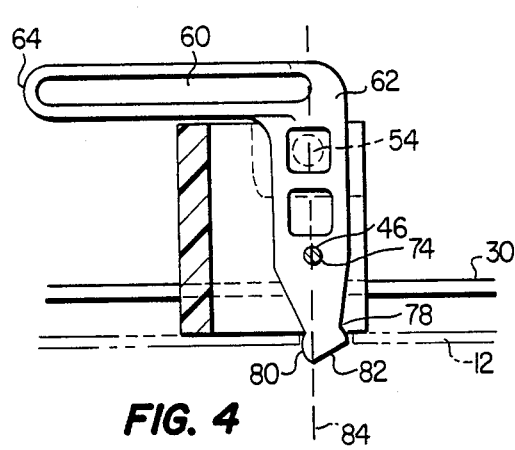
FIG. 4
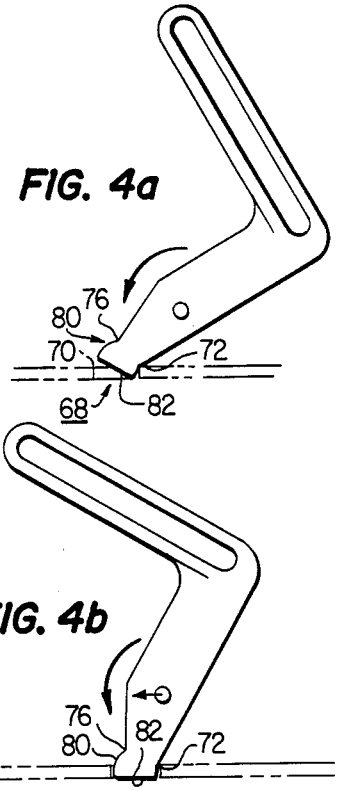
FIG. 4a
FIG. 4b

PLUG-IN CARD MODULE

TECHNICAL FIELD

The present invention relates generally to automatic call distribution (ACD) switching systems and more particularly to a novel plug-in module therefor which advantageously supports a plurality of individually removable electrical circuit boards.

BACKGROUND OF THE INVENTION

Automatic call distribution (ACD) systems are well-known in the prior art. These systems typically include a switching system for interfacing a plurality of telephone trunk lines to a plurality of agents each located at a workstation. An ACD system provides distribution of incoming calls to those agents who have been available for the longest period of time. The system queues calls on a first in, first-out basis if no agents are available to handle an incoming call.

Prior art switches for use in automatic call distribution systems typically include a plurality of line interface card modules supported in a rack module of a housing. Each of these card modules include a printed circuit board having suitable electronics for controlling communications from typically up to sixteen (16) individual telephone trunks. While such switches have proven generally reliable, it is quite common that components parts on the card modules therein must be replaced due to normal wear or malfunction. To this end, a technician is required to remove and replace the entire card module even though in a typical scenario only on of the sixteen telephone ports is defective The fact that an entire card module must be replaced even if only a single port therein is defective substantially increases the repair cost and decreases the reliability of the overall ACD system switch. As a corollary, it has not been cost effective in the prior art to provide significant processing capability on the plug-in card module itself because of the probability that the entire card may have to be replaced even if the processor therein remains fully operational.

There is therefore a need for an improved plug in card module for use in an automatic call distribution switching system which obviates the replacement of non defective components and which provides the capability of providing substantial modularity and increased processing capability at the line interfaces modules of the ACD switch.

BRIEF SUMMARY OF THE INVENTION

It is therefore an object of the present invention to provide a novel plug in card module for an automatic call distribution switch which supports a plurality of individually-removable electronic circuit boards.

It is yet another object of the invention to provide a plug-in card module which supports each of a plurality of "subcards" in close, parallel proximity to a support base thereof to provide substantial modularity and increased processing capability at the line interface modules of an ACD switch.

It is still another object of the invention to provide a novel locking mechanism for use in locking a subcard to a support base of a plug in card module such that the subcard and the support base are in a closely-aligned "piggybacked" relation.

It is yet a further object of the invention to provide an improved ejector mechanism supported on a faceplate of a plug in card module to facilitate the removal of the card module from the rack module in which it is supported.

These and other objects of the invention are achieved in a plug-in card module for use in a rack module, the rack module having means for supporting a plurality of plug in card modules in an abutting side by side relation. The plug in card module comprises a printed circuit board having first and second sides, a leading edge and a rear edge. At least two pairs of card receiving and guiding rails are transversely disposed on the printed circuit board, each of the pairs comprising first and second oppositely disposed elongate rails secured to the printed circuit board. The plug-in module also includes at least first and second electrical connectors longitudinally disposed on the printed circuit board in back-to-back or side by side relation, each of the electrical connectors dispose adjacent an associated pair of elongate guide rails. To provide increased modularity and ease of circuit component replacement, the plug in module includes a plurality of individually removable electrical circuit boards. Each electrical circuit board is slidably supported in a pair of elongate guide rails and includes a leading edge received in the associated electrical connector, and a rear edge on which is supported a locking mechanism for locking the electrical circuit board in the pair of elongate guide rails and its associated electrical connector.

In the preferred embodiment, the locking mechanism comprises two basic cooperating members, a latch support and a latch handle. The latch support includes a base secured to the electrical circuit board. First and second sidewalls extend upwardly from the base to define a space therebetween. Each of the sidewalls includes a stop extending a predetermined distance into the space. The latch handle includes a first section having a lifting surface, and a second section adapted to be pivotably supported in the space between the sidewalls of the latch support. The second section of the latch handle advantageously includes an extension at a bottom end thereof adapted for engaging a slot in the printed circuit board, the extension including a front lip, a rear lip and a cam surface located therebetween. In operation, the electrical circuit board is inserted into a pair of guide rails until the rear lip of the extension engages a rear lip of the slot in the printed circuit board and a lower end of the cam surface engages a front lip of the slot. The first section of the latch handle is then depressed causing the cam surface of the extension to rotate along the front lip of the slot. When the first section of the latch handle reaches a fully-depressed position, the electrical circuit board is locked into the electrical connector. In this locked position, the first section of the locking handle rests substantially adjacent the board itself and the second section of the locking handle is locked in an upright position by the stops in the sidewalls of the latch support.

To release the locking mechanism, the first section of the latch handle is lifted, causing the second section of the latching handle to be forced through the stops in the sidewalls of the latch support. As the first section continues to be lifted, the cam surface of the extension rotates in an opposite direction along the front lip of the slot in the printed circuit board. When the first section of the latch handle reaches its fully-released position, the rear lip of the extension disengages from the rear lip of the slot, thereby releasing the electrical circuit board from the printed circuit board.

According to a further feature of the present invention the plug-in card module includes a faceplate secured to the leading edge of the printed circuit board. The faceplate preferably has an integrally molded spring release mechanism at each end. Each such mechanism includes a locking tab secured to an underside of a release latch. The release latches ar adapted to be depressed to disengage the locking tabs from an edge of the rack module. In an alternate embodiment, each of the release mechanisms is provided with an ejector mechanism to facilitate the removal of the plug in card module from the rack module with significantly less force than what would otherwise be required through depression of the release tabs directly.

The foregoing has outlined rather broadly the more pertinent and important features of the present invention in order that the Detailed Description that follows may be better understood and such that the present contribution to the art can be more fully appreciated. Additional features of the invention will be described hereinafter which form the subject of the claims of the invention.

BRIEF DESCRIPTION OF THE DRAWINGS

For a more complete understanding of the nature and objects of the present invention, reference should be made to the following Detailed Description taken in connection with the accompanying Drawings in which:

FIG. 1 is a perspective view of a plug in card module of the present invention designed to be supported in a rack module of an automated call distribution (ACD) switch;

FIG. 2 is a schematic view of an alternate embodiment of the plug in card module of FIG. 1 wherein each of the electronic circuit boards supported thereon is oversized;

FIG. 3 is a perspective view, partially cutaway, of a preferred embodiment of a locking mechanism according to the present invention for use in locking an electronic circuit board to a printed circuit board of the plug in card module;

FIG. 4 is a cross-sectional view of the locking mechanism taken along lines 4—4' of FIG. 3;

FIGS. 4A and 4B are views of the locking mechanism of FIG. 4 in an initial closed state and an intermediate closed state;

Similar reference characters refer to similar parts through the several views of the drawings.

DETAILED DESCRIPTION

Figure 5:
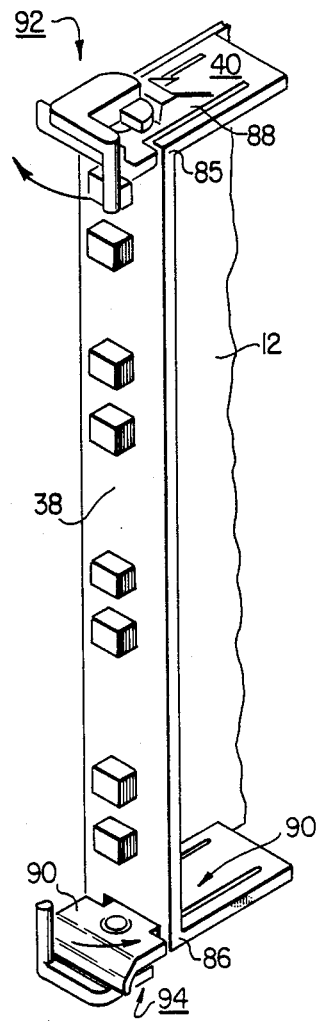
FIG. 5 is a perspective view of the faceplate of the plug in card module showing the panel ejector mechanism thereof for facilitating the removal of the plug in card module from the rack module.

Although not meant to be taken by way of limitation, preferably the plug-in card module of the present invention is adapted to be supported in a rack module or "card cage" (not shown) of an automatic call distribution (ACD) switch. As is well known, such ACD switches typically include a plurality of rack modules each including suitable means for supporting a plurality of plug-in card modules in a closely abutting side by-side relation. According to a feature of the invention, the novel plug in card module described below advantageously supports a plurality of electronic circuit boards or "subcards" in a "piggybacked" manner. This modularity provides significant advantages over prior art ACD switches by substantially reducing the cost of replacing defective components and substantially increasing the processing power of each individual subcard.

Referring now to FIG. 1, the plug in card module 10 of the present invention comprises a printed circuit board 12 having first and second sides 14 and 16, a leading edge 18 and a rear edge 20. The rear edge supports an elongate socket module 22 of known construction in which are housed sockets adapted to be connected to corresponding terminal strips mounted on a backplane of the ACD switch. The plug in card module includes a plurality of card receiving and guiding rails 24 transversely disposed in pairs on the printed circuit board. Each of the guide rail pairs 24a–b, 24c–d, 24e–f and 24g–h comprise first and second oppositely disposed elongate rails secured to the printed circuit board 12. Preferably, the printed circuit board includes appropriate slots 25 in which the guide rail 24 is inserted, and each of the guide rails has suitable locking tabs along the bottom surface thereof for securing the guide rail to the printed circuit board following insertion in the slots 25.

The plug-in card module 10 also includes a plurality of electrical connectors 26, with at least two of the electrical connectors, such as connectors 26a and 26b, longitudinally disposed on the printed circuit board 12 in back to back and/or side by-side relation. As seen in FIG. 1, each of the electrical connectors 26 is disposed adjacent an associated pair of elongate guide rails. For example, electrical connector 26a is disposed between the ends of the pair of guide rails 24a and 24b. To provide increased modularity and ease of circuit replacement, the plug in module 10 includes plurality of individually removable electrical circuit boards 30a–d. Each electrical circuit board 30 is slidably supported in a pair of elongate guide rails and includes a leading edge 32, to be received in an associated electrical connector, and a rear edge 34 on which is supported a locking mechanism 36 for locking the electrical circuit board 30 in the pair of elongate guide rails and its associated electrical connector. As will be described in more detail below, the plug in card module also includes a faceplate 38 secured by screws or the like to the leading edge 18 of the printed circuit board 12. The faceplate 38 includes an integrally molded spring release mechanism 40 at each end to facilitate the removal of the card module 10 from the rack module.

While in the preferred embodiment each of the plug in card modules includes four (4) "piggybacked" electronic circuit boards, this arrangement is not to be taken by way of limitation as any other number of subcards can be suitably supported in back-to back and/or side by side relation on the printed circuit board. Moreover, and with reference briefly to FIG. 2, it may also be desirable to provide one or more oversized electronic circuit boards 30a' and 30b instead of four (4) smaller boards. In the alternate embodiment of FIG. 2, each of the electronic circuit boards supports first and second locking mechanisms 36a and 36b substantially as shown. Of course, a plug in card module may also be provided with two standard size electronic circuit boards on one half of the module and one oversized circuit board on the other half thereof.

It should be appreciated that the "piggybacked" structures shown in FIGS. 1 and 2 provide substantial benefits over prior art ACD plug in card modules where each such module included all electronics on the printed circuit board itself. The use of small, modular electrical circuit boards stacked to a printed circuit board advantageously enables maintenance and/or repair of defective components without replacement of an entire module which might otherwise be fully operational. Moreover, the modularity of the plug in card module enables each subcard to be provided with a higher degree of processing capability because of the relatively lower cost of manufacturing each subcard vis-a-vis the cost of prior art printed circuit boards. For example, and not by way of limitation, one of the electrical circuit boards 30 can include an answer detection circuit or other digital signal processing circuits. Further, by providing modularity at the port level, the printed circuit board 12 can support its own processing capability as represented by the processor 41 and the associated memory and control devices 43. Therefore, the limitations of prior art ACD switches, namely, the inability to economically provide significant processing capability on the module itself, are overcome by the plug in card module of the present invention.

Referring now to FIG. 3, a perspective view, partially cutaway, is shown of the preferred locking mechanism 36 of the present invention. In the preferred embodiment, the locking mechanism comprises a latch support 42, and a latch handle 44 pivotally-supported on the latch support 42 by pin 46. The latch support 42 includes a base 48 secured to the electrical circuit board 30 by screws or the like. First and second sidewalls 50 and 52 extend upwardly from the base 48 to define a space therebetween. Each of the sidewalls 50 and 52 include an integrally molded stop 54 extending a predetermined distance into the space for the reasons to be described. The latch support 42 also includes first and second runners 56 and 58 extending from a bottom surface thereof adapted to maintain the electrical circuit board 30 in a fixed relation with respect to the printed circuit board 12 when the locking mechanism 36 is released.

Referring now simultaneously to FIGS. 3 and 4, the latch handle 44 preferably includes a first section 60, and a second section 62 adapted to be pivotably supported in the space between the sidewalls 50 and 52 of the latch support 42. The first section 60 of the latch handle includes a lifting surface 64. The second section 62 of the latch handle 44 advantageously includes an extension 66 at a bottom end thereof adapted for engaging a slot 68 in the printed circuit board 10. The slot 68 includes a front lip 70 and a rear lip 72. The extension 66 of the second section includes a recess 74 through which the pin 46 passes to enable the latch handle to be supported in the latch support. As also best seen in FIG. 4, the extension 66 includes a front lip 76, a rear lip 78, a cam surface 80 and a bottom edge 82. The front lip 76 and the cam surface 8 are located in front of a central axis 84 of the section while the rear lip 78 and the bottom edge 82 of the extension are located behind the central axis 84. This eccentric alignment provides certain operating advantages as will be described in more detail below.

In operation, an electrical circuit board 30 is inserted into a pair of guide rails until the rear lip 76 of the extension 66 engages the rear lip 72 of the slot 68 in the printed circuit board 12 and a lower end of the cam surface 80 engages the front lip 70 of the slot. This "initial closed" state is shown in FIG. 4A. The first section 60 of the latch handle 44 is then depressed causing the cam surface 80 of the extension 66 to rotate against the front lip 70 of the slot 68. This "intermediate closed" state is shown in FIG. 4B. When the first section 60 of the latch handle 44 reaches its fully depressed position, the electrical circuit boar 30 is locked into the electrical connector 26 as best seen in FIG. 4. In this locked position, the first section 60 of the locking handle 44 rests substantially adjacent the board itself and the second section 62 of the locking handle 4 is locked in an upright position by the stops 54 in the sidewalls 50 and 52 of the latch support 42.

To release the locking mechanism, the first section 60 of the latch handle 44 is lifted, causing the second section 62 thereof to be forced through the stops 54 in the sidewalls 50 and 52 of the latch support 42. As the first section 60 continues to be raised and rotated about pin 44, the cam surface 80 of the extension 66 rotates in the opposite direction against the front lip 70 of the slot 68 in the printed circuit board 12. When the first section 60 of the latch handle 44 reaches its fully-released position, the rear lip 78 of the extension 66 disengages from the rear lip 72 of the slot 68, thereby releasing the electrical circuit board 30 from the printed circuit board 12. The stops 54 also serve to limit movement of the latch handle 44 following removal of the board 30.

It should be appreciated that the locking mechanism of FIGS. 3 and 4 is quite advantageous because it facilitates the locking of two closely aligned parallel boards with little or no fulcrum on which to pivot the locking mechanism. This operation is facilitated by the eccentric or "off center" extension 66 attached to the second section of the locking handle. Moreover, when the locking handle is in the fully depressed or "locked" position, the profile of the locking mechanism is still within the depth of the plug-in card module (which is determined by the width of the face plate).

Referring now to FIG. 5, a perspective view is shown of the preferred faceplate for use in the card module 10 of the present invention. As noted briefly above, the faceplate 38 is secured by screws or the like to the leading edge 18 of the printed circuit board. Faceplate 38 includes first and second ends 85 and 86 each having the spring release mechanism 40 integrally formed therein. Each release mechanism includes a locking tab 88 secured to an underside of a release latch 90. To remove the plug in card module 10 from the rack module, the technician simultaneously depresses the release latches 90 to thereby disengage the locking tabs 88 from the card cage wall.

Figure 6:
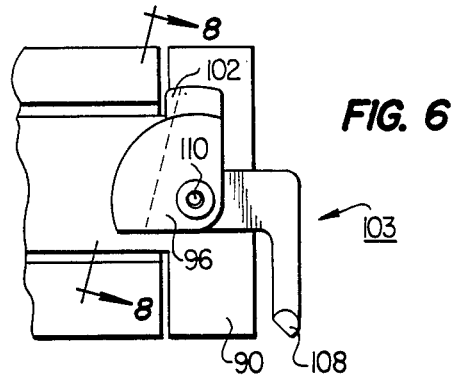
FIG. 6 is a view of the bottom ejector mechanism taken along lines 6—6' of FIG. 5.
Figure 7:
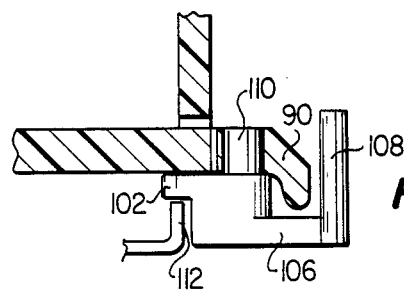
FIG. 7 is a side view of the bottom ejector mechanism taken along lines 7—7' of FIG. 5.
Figure 8:
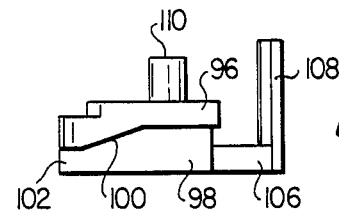
FIG. 8 is an end view of the bottom ejector mechanism taken along lines 8—8' of FIG. 6.

Alternatively, the faceplate 38 is provided with a panel ejector mechanism, comprising top and bottom ejector mechanisms 92 and 94, to facilitate removal of the card module from the rack module with significantly less force than what would otherwise be required through depression of the release latches directly. In particular, and with reference now simultaneously to FIGS. 6–8, bottom ejector mechanism 94 includes an arcuate upper section 96 and a base section 98 which extends beyond a portion of the upper section. The upper section includes a ramp surface 100 along an underside thereof and the base section 98 includes a tab 102 at an end thereof. The ejector mechanism 94 further includes a release lever 103 secured to the base section 98, the release lever including an angled portion 106 and a handle 108 adapted to be engaged and rotated to activate the mechanism. The ejector mechanism 94 includes a pin 110 adapted to support the mechanism in the release latch 90 of the spring release mechanism 40. In operation, as the release lever handle 108 is pivoted about the pin 110, the ramp surface 100 lifts the locking tab 88 clear of the card cage wall 112 and the tab 102 forces the card module out of the card cage. The top ejector mechanism 92 is identical to the bottom ejector mechanism 94 but is mounted in the opposite orientation so that the technician moves the release levers 103 in opposite directions to remove the card module.

The plug-in card module of the present invention facilitates the use of a distributed processing hierarchy in an automatic call distribution (ACD) switching system which has not heretofore been achieved. In particular, by enabling high level processing capabilities to be located on the printed circuit board or the subcards themselves, the disclosed plug-in card module allows switch control functions to be distributed across at least a four level hierarchy comprising (1) an overall switch controller at the highest level, (2) a shelf control module at an immediate level for controlling the plug in modules on a shelf of the ACD switch, (3) the plug-in card module itself at a next intermediate level, and (4) a subcard at the lowest level of the hierarchy.

It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

We claim:

1. A plug in card module for use in a rack module having means for supporting a plurality of plug in card modules in an abutting side by side relation, comprising:
   a printed circuit board having first and second sides, a leading edge and a rear edge;
   at least two pairs of card receiving and guiding rails transversely disposed on the printed circuit board, each of the pairs comprising first and second oppositely-disposed elongate rails secured to the printed circuit board;
   first and second electrical connectors longitudinally disposed on the printed circuit board, each said electrical connector disposed adjacent an associated pair of said elongate rails; and
   an electrical circuit board slidably supported in each pair of elongate guide rails, the electrical circuit board having a leading edge received in the associated electrical connector, and a rear edge; and
   means which engages said printed circuit board and is supported on the rear edge of each electrical circuit board for locking a electrical circuit board, in the pair of said elongate rails and its associated said electrical connector.

2. The plug in card module as described in claim 1 wherein the locking means comprises:
   a latch support having a base secured to the electrical circuit board, the latch support having first and second sidewalls defining a space therebetween;
   a latch handle having a first section, and a second section adapted to be pivotably supported in the space between the sidewalls of the latch support, the second section of the latch handle including an extension at a bottom end thereof having a front lip, a rear lip and a cam surface located therebetween, the rear lip of the extension adapted to engage a rear lip of a slot in the printed circuit board and the cam surface adapted to engage a front lip of the slot when the leading edge of the electrical circuit board is inserted into the electrical connector;
   wherein as the first section of the latch handle is depressed the cam surface of the extension rotates along the front lip of the slot until the electrical circuit board is locked into the electrical connector.

3. The plug in card module as described in claim 2 wherein each of the sidewalls of the latch support includes a stop extending a predetermined distance into the space between the sidewalls for limiting movement of the latch handle.

4. The plug in card module as described in claim 2 wherein the base of the latch support also includes first and second runners extending from a bottom surface thereof for maintaining the electrical circuit board in a fixed relation with respect to the printed circuit board when the locking mechanism is released.

5. The plug in card module as described in claim 1 further including a faceplate secured to the leading edge of the printed circuit board.

6. The plug-in card module as described in claim 5 wherein the faceplate includes an integrally molded spring release mechanism at each end thereof, the spring release mechanism including a release latch and a locking tab secured to an underside of the release latch, the release latch adapted to be depressed to disengage the locking tab from the rack module.

7. The plug in card module as described in claim 5 wherein the faceplate further includes an ejector mechanism associated with each spring release mechanism for simultaneously depressing the release latch and forcing the faceplate away from the rack module.

8. The plug in card module as described in claim 7 wherein the ejector mechanism comprises:
   a pin rotatably supported in the release latch;
   a release lever adapted to be rotated about the pin; and
   means attached to the pin and the release lever for releasing the locking tab from an edge of the rack module and forcing the faceplate away from the rack module as the release lever is rotated about the pin.

9. The plug in card module as described in claim 1 wherein the first and second electrical connectors are disposed in a back to back relationship.

10. The plug in card module as described in claim 1 wherein the first and second electrical connectors are disposed in a side-by side relationship.

11. A plug in card module for use in an automatic call distribution (ACD) switch having a plurality of rack modules, each of the rack modules having means for supporting a plurality of plug in card modules in an abutting side by-side relation, comprising:
   a printed circuit board having first and second sides, a leading edge and a rear edge;
   at least four pairs of card receiving and guiding rails transversely disposed on the printed circuit board, each of the pairs comprising first and second oppositely disposed elongate rails secured to the printed circuit board;

first, second, third and fourth electrical connectors longitudinally disposed on the printed circuit board in back to-back and side by-side relation, each of the electrical connectors disposed adjacent an associated pair of said elongate rails;

an electrical circuit board slidably supported in each pair of said elongate rails, the electrical circuit board having a leading edge received in the associated said electrical connector, and a rear edge;

a latch support having a base secured to each electrical circuit board, the latch support having first and second sidewalls defining a space therebetween; and a latch handle supported in each latch support, the latch handle having a first section, and a second section adapted to be pivotably supported in the space between the sidewalls of the latch support, the second section of the latch handle including an extension at a bottom end thereof adapted for engaging a slot in the printed circuit board to lock the electrical circuit board in a pair of said elongate rails and its associated said electrical connector.

12. The plug in card module as described in claim 11 further including a faceplate secured to the leading edge of the printed circuit board.

13. The plug in card module as described in claim 12 wherein the faceplate includes an integrally molded spring release mechanism at each end thereof, the spring release mechanism including a release latch and a locking tab secured to an underside of the release latch, the release latch adapted to be depressed to disengage the locking tab from the rack module.

14. The plug-in card module as described in claim 13 wherein the faceplate further includes an ejector mechanism associated with each spring release mechanism for simultaneously depressing the release latch and forcing the faceplate away from the rack module.

15. A plug-in card module for use in an automatic call distribution (ACD) switch having a plurality of rack modules, each of the rack modules having means for supporting a plurality of plug-in card modules in an abutting side-by side relation, comprising:

a printed circuit board having first and second sides, a leading edge and a rear edge;

at least two pairs of card receiving and guiding rails transversely disposed on the printed circuit board, each of the pairs comprising first and second oppositely disposed elongate rails secured to the printed circuit board;

first and second electrical connectors longitudinally disposed on the printed circuit board in back to back relation, each of the electrical connectors disposed adjacent an associated pair of said elongate rails; and an electrical circuit board slidably supported in each pair of elongate guide rails, the electrical circuit board having a leading edge received in the associated electrical connector and a rear edge;

means which engages said printed circuit board and is supported on the rear edge of each electrical circuit board for locking a electrical circuit board in the pair of said elongate rails and its associated said electrical connector; and a faceplate secured to the leading edge of the printed circuit board and including a spring locking release mechanism at each end thereof for releasing the card module from the rack module.

16. The plug in card module as described in claim 16 wherein the faceplate further includes an ejector mechanism associated with each spring release mechanism to facilitate removal of the plug in card module from the rack module.

* * * * *